United States Patent
Poggi et al.

(10) Patent No.: US 9,332,864 B2
(45) Date of Patent: May 10, 2016

(54) REINFORCED SHELVES FOR METAL SHELVING UNITS, FOR SUPPORTING ON THEIR FRONT ELECTRONIC LABELS AND/OR OTHER PERIPHERALS AND RELATED MANUFACTURING PROCESS

(71) Applicant: CEFLA SOCIETA' COOPERATIVA, Imola (IT)

(72) Inventors: Massimo Poggi, Borgo Tossignano (IT); Eros Nanni, Castel San Pietro (IT)

(73) Assignee: Cefla Societa' Cooperativa, Imola (IT)

( * ) Notice: Subject to any disclaimer, the term of this patent is extended or adjusted under 35 U.S.C. 154(b) by 24 days.

(21) Appl. No.: 14/444,724

(22) Filed: Jul. 28, 2014

(65) Prior Publication Data

US 2015/0034574 A1 Feb. 5, 2015

(30) Foreign Application Priority Data

Jul. 31, 2013 (BO) .......................... BO2013A000414

(51) Int. Cl.
 *H05K 7/00* (2006.01)
 *A47B 96/02* (2006.01)
 (Continued)

(52) U.S. Cl.
 CPC ............... *A47F 5/0043* (2013.01); *A47B 96/02* (2013.01); *A47B 96/021* (2013.01); *G09F 13/02* (2013.01); *H05K 7/02* (2013.01); *Y10T 29/49002* (2015.01)

(58) Field of Classification Search
 CPC ...... A47B 96/02; A47B 96/021; A47F 3/001; A47F 5/0043; A47F 11/10; G09F 13/02; H01R 25/14; H01R 25/16; H05K 7/02
 USPC ............................... 211/26, 90.01, 90.02, 153
 See application file for complete search history.

(56) References Cited

U.S. PATENT DOCUMENTS

| | | | | | |
|---|---|---|---|---|---|
| 2,845,187 | A | * | 7/1958 | Bianchi ................ | A47B 57/425 108/147.17 |
| 3,081,718 | A | * | 3/1963 | Shoffner ................ | A47B 96/04 108/108 |

(Continued)

FOREIGN PATENT DOCUMENTS

| | | | | |
|---|---|---|---|---|
| DE | 3439657 A1 | * | 4/1986 | ............. A47B 57/42 |
| DE | 29702781 U1 | * | 4/1997 | ............. A47B 97/00 |
| EP | 0251474 | | 1/1988 | |

OTHER PUBLICATIONS

Search Report & Written Opinion of the ISA (EPO) relating to Italian Patent Application No. BO2013A000414; Apr. 4, 2014; 7 pages.

*Primary Examiner* — Joshua Rodden
(74) *Attorney, Agent, or Firm* — Stetina Brunda Garred & Brucker

(57) ABSTRACT

Reinforced shelf for metal shelving unit, particularly for the shelving units whose shelves (B1, Bn) are provided, on the side facing the public, with electronic labels and/or other peripherals, and wherein the shelf on its bottom side has plate reinforcement (T1, Tn), parallel to each other and to the front and rear side (LA, LP) of the shelf itself, characterized in that in correspondence or at the ends of the reinforcements (T1, Tn) there are provided at least a pair of apertures (1, 10) for the passage and support of wiring (D), necessary to connect means (P1) on the rear side of the shelves, to means (P2) on the front side of the shelf (B1, Bn) for supporting and displaying goods. The apertures (1, 10) are sufficiently distant from the angular bent and ribbed areas of the reinforcements (T1, Tn) so as not substantially modify the characteristics of bend strength and torsion resistance of the reinforcements. The apertures (1, 10) are preferably obtained during the manufacture of reinforcements (T1, Tn) and of relative displaying shelves (B1, Bn).

10 Claims, 3 Drawing Sheets

(51) Int. Cl.
*A47F 5/00* (2006.01)
*G09F 13/02* (2006.01)
*H05K 7/02* (2006.01)

(56) References Cited

U.S. PATENT DOCUMENTS

| | | | | |
|---|---|---|---|---|
| 3,196,812 A | * | 7/1965 | Jacques | A47B 96/021 108/108 |
| 4,489,995 A | * | 12/1984 | Barr | A47F 3/0447 312/116 |
| 4,549,777 A | * | 10/1985 | Schindler | A47B 53/02 211/1.51 |
| 5,348,485 A | | 9/1994 | Briechle | |
| 5,626,084 A | * | 5/1997 | Kelly | A47B 96/02 108/23 |
| 5,690,415 A | * | 11/1997 | Krehl | A47F 5/101 108/23 |
| 6,173,543 B1 | * | 1/2001 | Gortsema | A47B 21/00 211/26 |
| 6,181,299 B1 | * | 1/2001 | Frederick | G06F 3/147 345/2.1 |
| 6,364,273 B1 | * | 4/2002 | Otema | A47F 5/0043 248/235 |
| 7,249,872 B2 | * | 7/2007 | Ragsdale | A47F 7/00 362/432 |
| 2014/0055987 A1 | * | 2/2014 | Lindblom | A47F 3/001 362/125 |
| 2014/0224875 A1 | * | 8/2014 | Slesinger | H01R 25/142 235/385 |
| 2014/0263109 A1 | * | 9/2014 | Lindblom et al. | A47F 5/101 211/26.2 |

* cited by examiner

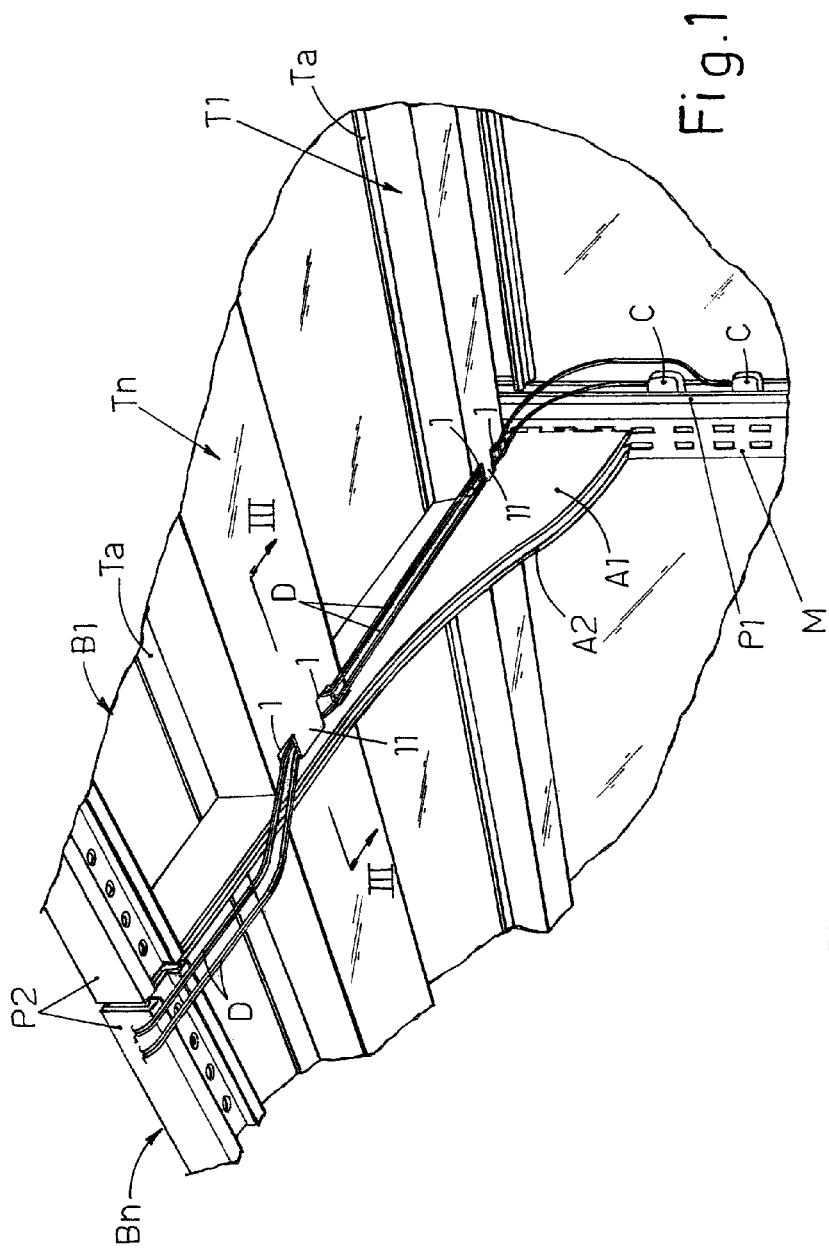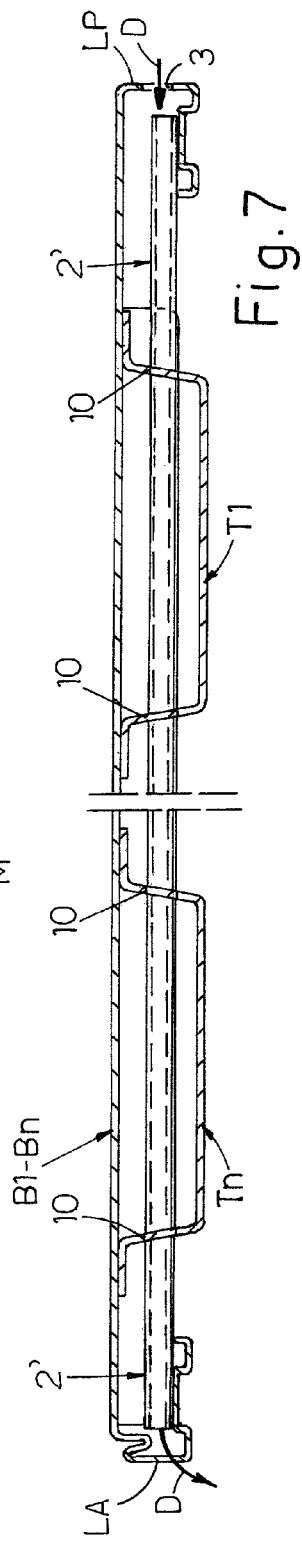

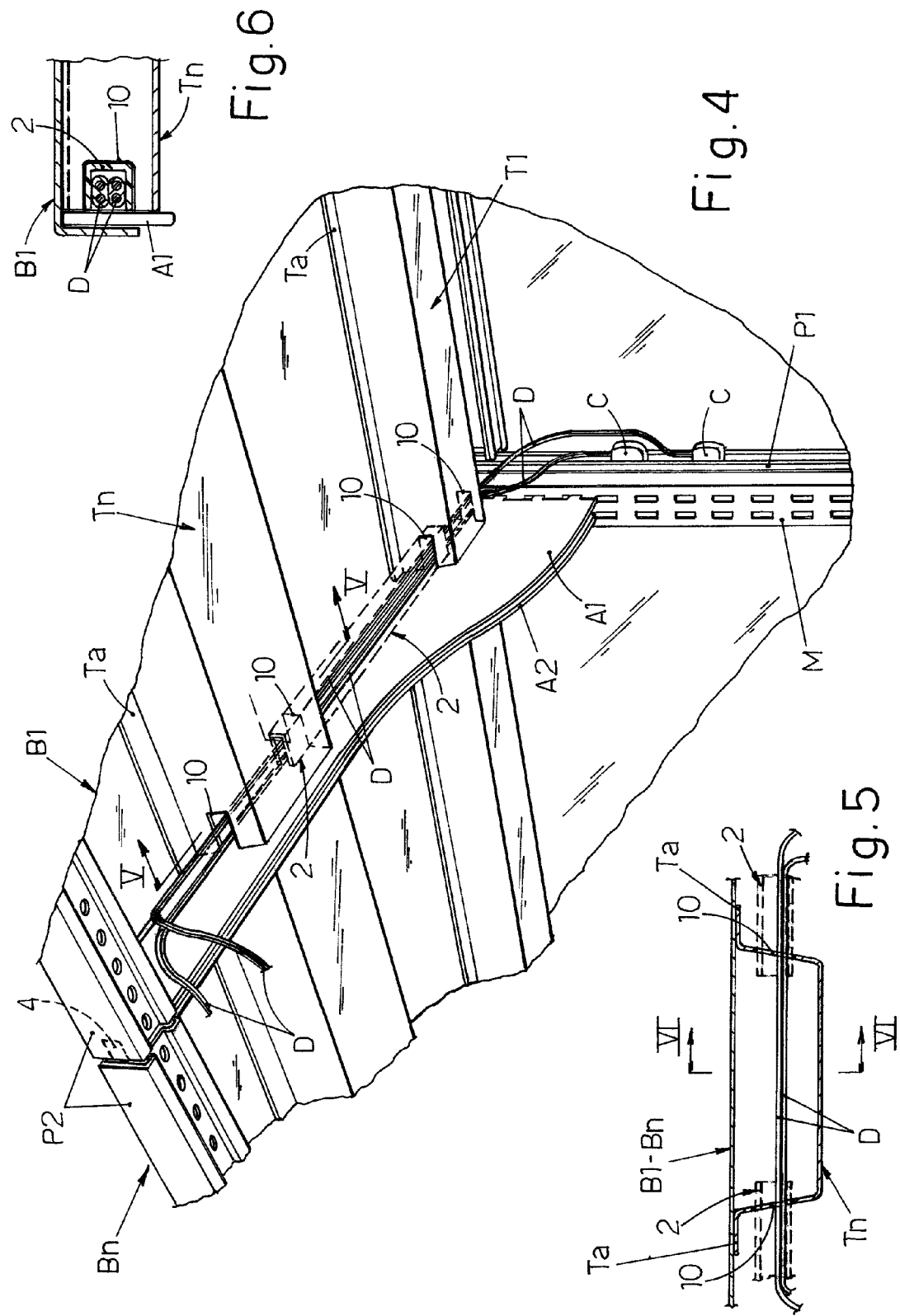

REINFORCED SHELVES FOR METAL SHELVING UNITS, FOR SUPPORTING ON THEIR FRONT ELECTRONIC LABELS AND/OR OTHER PERIPHERALS AND RELATED MANUFACTURING PROCESS

CROSS REFERENCE TO RELATED APPLICATIONS

The present application claims priority to Italian Patent Application No. BO2013A000414 filed Jul. 31, 2013, the contents of which are expressly incorporated herein by reference.

STATEMENT RE: FEDERALLY SPONSORED RESEARCH/DEVELOPMENT

Not Applicable.

BACKGROUND OF THE INVENTION

The present invention relates to reinforced shelves for metal shelving units; in particular, the present shelves support electronic labels and/or other peripherals on their front (facing the public) side; the labels are connected to electric wiring coming from the rear side of the shelf itself. The present invention tackles the manufacturing process for manufacturing said reinforced shelves, too.

In U.S. Pat. No. 5,348,485 filed on Apr. 12, 1993, having the title "Electronic price display system with vertical rail", a metal shelving unit for displaying goods for sale is described. Such shelving unit is provided, in correspondence of its uprights, with a vertical rail, to which, in correspondence of each displaying shelf, plugs can be connected, with relative flexible wiring, transversally extending under each shelf, while the other end of rail is connected to another fixed linear rail on the front side of the same shelf, on which electronic labels are fixed. Said flexible electric wiring is fixed to the bottom part of each shelf, or to the internal side of the bracket supporting the shelf itself, through either cable ties, or U-bolts, or adhesive raceways, or a raceway that can be hooked to the near bracket, which are unaesthetic, not reliable, and which do not sufficiently protect the wiring from the interference with the goods displayed on the shelves or other objects, in that the wiring passes always under the reinforcements of the display shelf.

As the electrically supplied appliances are normally fixed to shelf, while the wiring is fixed to brackets, all the above-mentioned solutions make the mounting and demounting of a shelf difficult; as a matter of fact, in order to remove a shelf, firstly wiring must be disconnected, and afterwards the shelf must be disengaged from its brackets.

SUMMARY OF THE INVENTION

The present invention aims to solve the following technical problem: Providing the reinforced shelves of metal shelving units with simple, economic, and reliable means for supporting and preferably also for containing and concealing said electric wiring, connecting said vertical rail to said horizontal rail, so that the wiring itself is in an uplifted safe and protected position, non interfering with the placing on, or the seizing of, goods from the displaying shelves of the shelving unit. The means are such as not to limit the mobility of the display shelves, even if they are provided, on their front side, with devices connected to said electric wiring.

The present invention solves the present technical problem as described in the annexed claim 1 and in the other claims depending therefrom, which teach to get, in correspondence of at least one of the ends of at least a bottom reinforcements of each shelf, some small bottom and/or lateral apertures, to allow the passage of said wiring, the apertures being preferably obtained on the reinforcement during its manufacturing through punching and bending of a plate sheet.

BRIEF DESCRIPTION OF THE DRAWINGS

Further characteristic features of the invention and the advantages arising therefrom will emerge more clearly from the following description of a preferred embodiment thereof, illustrated purely by way of a non-limiting example in the figures of the three sets of drawings in which:

FIG. 1 shows a perspective and transversal view of the bottom part of a reinforced shelf with a first solution for the passage and support of electric wiring:

FIG. 4 shows a perspective and transversal view of the bottom part of a reinforced shelf with a second solution for the passage and support of electric wiring;

FIG. 5 shows other details of the second solution according to section V-V of FIG. 4;

FIG. 6 shows other details of the second solution according section VI-VI of FIG. 5;

FIG. 7 shows the transversal section of a reinforced shelf, with the details for inserting a raceway in the end apertures of the reinforcements of the same shelf;

DETAILED DESCRIPTION OF THE INVENTION

In FIG. 1, P1 indicates a continuous socket, in the form of a vertical rail fixed on a side of a post M of a metal shelving unit, which in this example supports on the same post M two brackets A1, A2 for the coplanar supporting of two shelves B1, Bn for supporting and displaying goods for sale. In FIG. 1 the shelves B1 and Bn are shown in a bottom view, to highlight that they are usually reinforced through beams T1, Tn parallel to each other and to the front and rear sides of the shelves themselves. The beams are obtained from plate sheets through punching and bending, and usually have a upside-down omega ($\Omega$) profile, with a central tract having e.g. an isosceles trapezoid profile. The wings Ta of the beams are fixed with welding spots to the bottom face of the shelf. The ends of reinforcements T1, Tn, which can be present in a number greater than two, and which are opportunely distanced to ensure the necessary load bearing, are positioned at a short distance or substantially touch the brackets A1, A2 supporting the shelves. In the same FIG. 1, C indicates some plugs connected to an end of electric wiring D; the plugs are inserted in the desired area of the vertical rail P1 so that the wiring D passes under the shelf, while the distal end of wiring D can be connected to horizontal sockets or rails P2 fixed on the front side of shelves B1 and Bn to support electronic labels or other peripherals. The peripherals from the same wiring receive the necessary connection to remote supplying and/or control units, in their turn connected to the electric wiring of the vertical rail P1.

Figures 2, 2A:
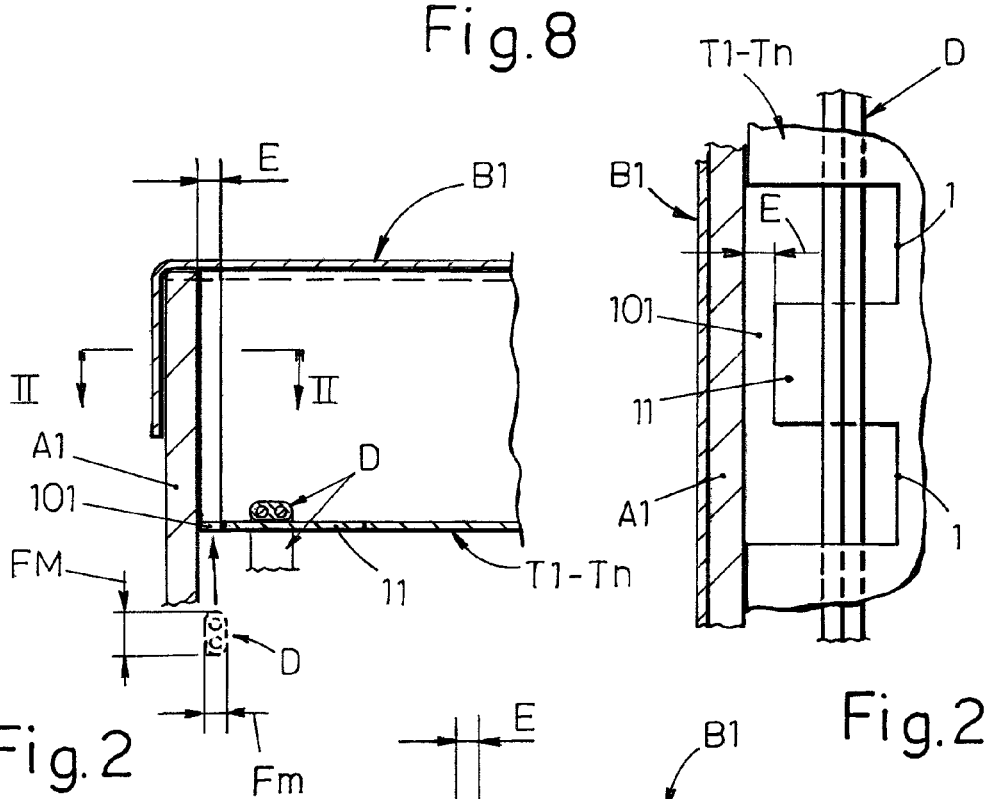
FIGS. 2 and 3 show different embodiments of FIG. 1 solution sectioned according to line III-III.
FIG. 2a shows other details according to section line II-II of FIG. 2.

In order to support in the correct position said electric wiring D, the present invention provides to form in correspondence or at the ends of the bottom walls of said reinforcements T1, Tn, pairs of slits 1 having dimensions sufficient to allow the passage of the wiring D and of the optional plugs C, preassembled at the end of said wiring. The slits 1 are sufficiently distant from the bottom angle area of the reinforcements, so that their presence does not substantially modify the characteristics of bend strength and torsion resistance imparted by the reinforcement to the shelf. Advantageously, the slit 1 which can be present on one end only of the reinforcements, or on both ends of the reinforcements T1, Tn, is obtained without additional cost, when the reinforcements are manufactured with the usual operations of punching and bending of plate sheets, with a simple modification of the punching unit in order to enable it to the cut said slits 1. From FIG. 1 it is apparent that slits 1 can be used as conduit, and that the wiring D passing through the slits is positioned in the near vicinity of the bottom face of the shelf, and in this way the interference with the goods placed on, and seized from, said shelf is prevented. As a consequence of the presence of said slits 1 at the end of the bottom wall of reinforcements T1, Tn, between said slits a tongue 11 is formed, that in the previously considered hypothesis can touch the bracket A1 supporting the shelf B1. The embodiment illustrated in FIGS. 2 and 2*a* shows that said tongue 11, during its manufacturing, can be opportunely shortened, so that its free end is positioned at a distance E from bracket A1, in order to form a passage 101 connecting every pair of slits 1. Said distance E is chosen so that it is equal, slightly inferior or slightly superior to the external minimal dimension Fm of wiring D. If wiring D is of oval shape as in FIG. 2, it has a maximal dimension FM. The presence of said passage 101 allows to easily insert said wiring D in said passage 101, using the minor dimension Fm, and to support wiring D through the tongue 11 and in the slits 1. Thanks to the support of the tongue 11, wiring D tends to position horizontally, with the major dimension FM, as shown in FIG. 2 with a continuous line, so as to remain trapped in slits 1 and supported by tongue 11. The great simplification deriving from the solution of FIGS. 2, 2*a* is apparent, in that wiring D can be hooked to and unhooked from tongues 11 of slits 1 in any moment, even when the shelf is mounted, in an easy and quick way, without the need of inserting longitudinally wiring D with a zigzag in slits 1, with further complications which would ensue when to the end of wiring C a plug C is assembled.

Figure 3:
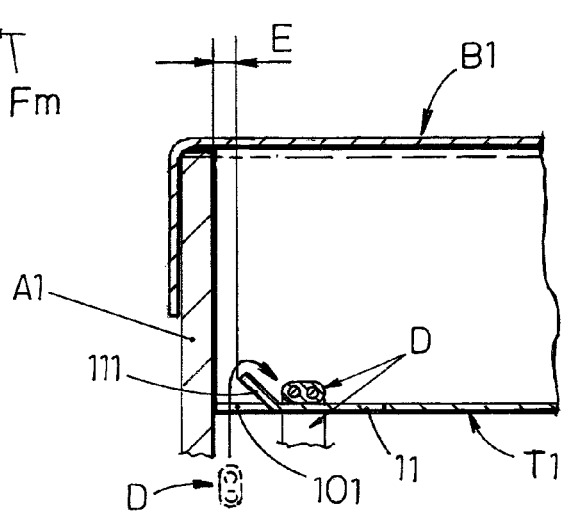

The embodiment of FIG. 3 differs from that of FIGS. 2 and 2*a* in that the tongue 11, instead of being shortened for forming the passage 101 as explained above, is bent upwards with its free end 111, in order to form a small hook keeping wiring D on tongue 1, with any disposition of wiring D itself.

In a further development of the present embodiment, the load resistance to nominal load was tested, by applying to the shelf itself some reinforcements having only one slit 10, rather than on the bottom wall end, as before shown with 1 in FIG. 1, on the end of the two opposing lateral walls, as shown in FIG. 4. Placing the same slits 10 in a position sufficiently distant from the bent, and therefore ribbed, angle area that connects the lateral walls of the reinforcement to the bottom wall and to the fixing wings, the load bearing of the shelf is not substantially modified.

Observing FIG. 4 and comparing it with FIG. 1, it is apparent that with the solution of FIG. 2 the wiring D is placed in a position nearer to the shelf, and farther from the bottom face of the reinforcements, and therefore in a safer non-interfering position with the goods displayed on the shelves.

The embodiment of FIG. 4 allows to confine the tracts of wiring D running between two consecutive reinforcements of the same shelf within tracts of raceway 2 having a C-profile, like in FIG. 6. As shown in FIGS. 4 and 5, C-profile tracts can be inserted and supported with the opposing slit ends 10 of the same reinforcements T1, Tn. The raceways 2 are made of plastics, can be transparent or non-transparent, and can also have characteristics of electric insulation. It is understood that other suitable materials can be employed for forming the raceways 2 and 2', further described.

The same embodiment of FIG. 4 suggested the hypothesis shown in FIG. 7, showing the possible transversal conformation of a metal shelf B1, Bn, wherein LA and LP indicate the front side and the rear side of the same shelf, respectively, both usually profiled with bent parts towards the ground and then towards the internal and lower part of the same shelf. FIG. 7 teaches that, arranging in advance a small slot or slit 3 aligned to the lateral slits 10 of the reinforcements T1, Tn, from said aperture a raceway 2' can be introduced, crossing all the slits of end 10 of the reinforcements, extending along all the length of the short side of the shelf, to support wiring C substantially for all its tract below the shelf, to better protect and conceal it, with both functional and aesthetic advantages. The slot or slit 3 of the shelf can be obtained during the manufacture of the shelf itself, too, through punching and bending of a plate sheet.

Figure 8:
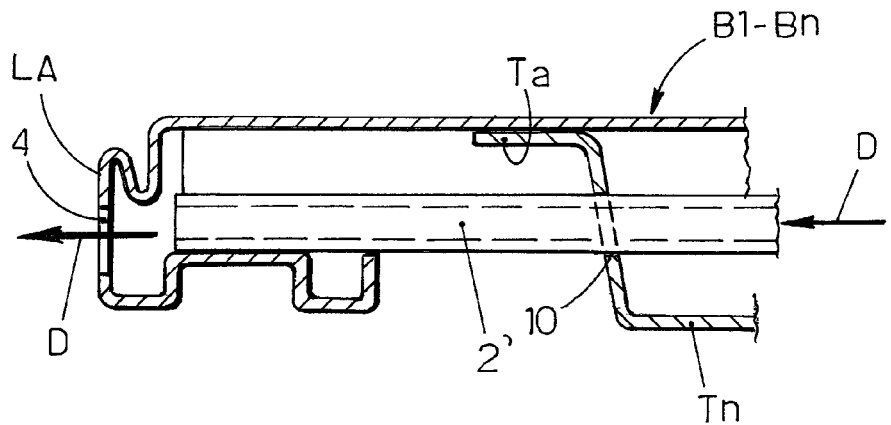
FIG. 8 shows the visible side of the reinforced shelf according to the section of FIG. 7 with another possible embodiment.

On the front side LA of shelves B1, Bn, a small aperture 4 can be obtained as shown in FIGS. 4 and 8, sufficiently aligned to lateral slits 10 of reinforcements T1, Tn of display shelf B1, Bn, and having a minimal dimension, with a limited aesthetical impact, so as to allow the passage of at least wiring D only, without distal plug. Thanks to the presence of said aperture 4, wiring D can arrive on the front side LA of the display shelf without passing under said side, and therefore without any possible interference with the goods inserted on or seized from the said display shelf. It is understood that the aperture 4 can be present also when rear aperture 3 is not present, and raceways 2 or 2' are not used.

It is understood that reinforcements T1, Tn and shelves B1, Bn can have any profile, even different from that shown, and that the slits 1, 10 can have any desired form, more suitable for the present aims. So for instance the slits 1, 10 instead of having a U profile, may be provided with a restricted neck at their open end, so as to better restrain the wiring D inside said slits, and that the slots can replace slits, without for this departing from the underlying principle of the invention. The raceways 2, 2' can have any form and/or composition, too.

It is understood that to the present invention numerous variants and modification can be introduced, without for this departing from the underlying principle of the invention as described, illustrated and claimed in the following.

In the claims, the reference numbers shown in brackets are purely indicative and do not limit the scope of protection of the claims.

What is claimed is:

1. Reinforced shelf for a metal shelving unit having shelves comprising a front side with electronic labels, lighting bars and/or other peripherals and a rear side, and wherein said shelves on their bottom side have a plurality of plate reinforcements, parallel to each other and to the front and rear side of the shelf itself, at the ends of said reinforcements there are provided at least a pair of apertures for the passage and support of wiring, necessary to connect means on the rear side of said shelves, to means on the front side of the shelves for supporting and displaying goods, said reinforcements being provided with angular bent and ribbed areas, and said apertures being sufficiently distant from the angular bent and ribbed areas of said reinforcements so as to not substantially modify the characteristics of bend strength and torsion resistance of the reinforcements.

2. Reinforced shelf according to claim 1, the reinforcements comprising an inferior wall and wherein said apertures are at least a pair of slits or slots placed either at one or both the ends of the inferior wall of said reinforcements, so that between every pair of said slits or slots a tongue is obtained, capable of supporting said wiring coming in and out from the slits or slots.

3. Reinforced shelf according to claim 2, wherein said tongue has a length inferior to a length of the inferior wall of the reinforcements from which said slits or slots are obtained, so that a free end of the tongue itself is at a sufficient distance from a bracket supporting shelf to form a passage connecting to each other each pair of said slits or slots, said distance being equal, slightly shorter or slightly longer than an exterior dimension of the wiring, so that the wiring can be inserted into said passage to engage neighboring ones of the slits or slots and to be supported by the respective tongues.

4. Reinforced shelf according to claim 2, wherein said tongue is totally or partially bent upwards, so that a free end of the tongue is at a sufficient distance from a bracket supporting shelf, to form a passage connecting to each other every said pair of slits or slots, said distance being equal, slightly shorter or slightly longer to an exterior dimension of the wiring, so that the wiring can be inserted into said passage to engage near ones of the slits or slots and to be supported by the respective tongues, which, with its free end prevents the accidental removal of the wiring.

5. Reinforced shelf according to claim 1, wherein said apertures are formed by slits or slots placed either on one or both ends of lateral walls of said reinforcements, and are aligned to each other.

6. Reinforced shelf according to claim 5, wherein raceway tracts are inserted and friction-fixed into the slits or slots, for protecting and concealing the external tracts of wiring, said raceways having a U- or C-profile.

7. Reinforced shelf according to claim 5, wherein on the rear side of the shelves, preferably during the manufacturing step of the shelves, a slit or slot is obtained, which is aligned to said slits or slots of the reinforcements, said slit or slot being useful to contain a raceway extending substantially for all the extension of the side of the shelves, which is to contain substantially all the tract of the wiring passing under every one of the shelves.

8. Reinforced shelf according to claim 1, wherein said apertures have dimensions capable of allowing the passage of the wiring and of optional connecting plugs, preassembled at ends of the wiring.

9. Reinforced shelf according to claim 1, further comprising on the front side of the shelf, on an end of sides are small bottom apertures for the passage and support of the wiring, the small apertures useful at least for the passage of the wiring itself.

10. Method for manufacturing the reinforced shelves for metal shelving units, according to claim 1, characterised in that in the manufacturing step of said shelves and/or the reinforcements to be fixed on the bottom of said shelves, during operations of punching and bending through which the shelves and/or the reinforcements are produced, in correspondence or at the ends of the reinforcements, and optionally also on shelf rear side and/or the front side, the apertures are obtained for the passage and support of the wiring.

\* \* \* \* \*